United States Patent
Blaum et al.

(10) Patent No.: US 7,142,134 B2
(45) Date of Patent: Nov. 28, 2006

(54) TECHNIQUES FOR GENERATING MODULATION CODES USING RUNNING SUBSTITUTIONS

(75) Inventors: Mario Blaum, San Jose, CA (US); Ksenija Lakovic, San Jose, CA (US); Bruce A. Wilson, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 11/049,554

(22) Filed: Feb. 1, 2005

(65) Prior Publication Data

US 2006/0170578 A1    Aug. 3, 2006

(51) Int. Cl.
*H03M 7/00* (2006.01)
*H03M 13/21* (2006.01)

(52) U.S. Cl. ............................ 341/58; 341/81
(58) Field of Classification Search .............. 341/58, 341/59, 81
See application file for complete search history.

(56) References Cited

U.S. PATENT DOCUMENTS

| | | | |
|---|---|---|---|
| 4,707,681 A | | 11/1987 | Eggenberger et al. |
| 4,786,890 A | * | 11/1988 | Marcus et al. ............... 341/81 |
| 4,818,969 A | | 4/1989 | Krakauer et al. |
| 5,062,011 A | * | 10/1991 | Hase et al. ................... 360/40 |
| 5,241,309 A | | 8/1993 | Cideciyan et al. |
| 5,311,521 A | | 5/1994 | Fitingof et al. |
| 5,757,294 A | | 5/1998 | Fisher et al. |
| 5,757,822 A | | 5/1998 | Fisher et al. |
| 5,760,718 A | | 6/1998 | Schouhamer Immink |
| 6,018,304 A | * | 1/2000 | Bessios ........................ 341/58 |
| 6,198,582 B1 | * | 3/2001 | Tsang et al. .................. 360/40 |
| 6,236,340 B1 | | 5/2001 | Patapoutian et al. |
| 6,417,788 B1 | | 7/2002 | McEwen et al. |
| 6,456,208 B1 | * | 9/2002 | Nazari et al. ................ 341/59 |
| 6,557,124 B1 | * | 4/2003 | Cideciyan et al. .......... 714/701 |
| 7,030,789 B1 | * | 4/2006 | Cideciyan et al. ............ 341/83 |
| 2003/0026028 A1 | * | 2/2003 | Ichihara et al. .............. 360/65 |

OTHER PUBLICATIONS

J.D. Coker et al., "Implementation of PRML in a rigid disk drive", IEEE Transactions on Magnetics, vol. 27, No. 6, Nov. 1991.
Roy D. Cideciyan et al., "A PRML system for digital magnetic recording", IEEE Journal on Selected Areas in Communication, vol. 10, No. 1, Jan. 1992.
E. Eleftheriou et al., "Noise-predictive maximum-likelihood (NPML) detection for the magnetic recording channel", IEEE 1996, no month.

(Continued)

*Primary Examiner*—Howard L. Williams
(74) *Attorney, Agent, or Firm*—Townsend and Townsend and Crew LLP

(57) ABSTRACT

Techniques are provided for performing substitutions of bit sequences that are known to cause errors. Input data is initially modulation encoded. The modulated data is then analyzed in a sliding window to determine if it contains any additional bit sequences that are known to cause errors. If an error prone bit sequence is identified in the data, a substitution engine replaces the error prone bit sequence with a predetermined pattern of bits that is less likely to cause errors. The bit stream output of the substitution engine is then recorded on a storage medium. The recorded bit stream is decoded when it read from the medium. The decoding process identifies the substituted bit pattern and replaces the substituted pattern with the original sequence of bits.

19 Claims, 4 Drawing Sheets

OTHER PUBLICATIONS

Jonathan D. Coker et al., "Noise-Predictive Maximum Likelihood (NPML) Detection", IEEE Transactions on Magnetics, vol. 34, No. 1, Jan. 1998.

Jaekyun Moon et al., "Maximum Transition Run Codes for Data Storage Systems", IEEE Transactions on Magnetics, vol. 32, No. 5, Sep. 1996.

Roy D. Cideciyan et al., "Maximum Transition Run Codes for Generalized Partial Response Channels", IEEE Journal on Selected Areas in Communications, vol. 19, No. 4, Apr. 2001.

Kees A. Schouhamer Immink et al., "Codes for Digital Recorders", IEEE Transactions on Information Theory, vol. 44, No. 6, Oct. 1998.

"Circuitry for Performing Error Correction Calculations on Baseband Encoded Data to Eliminate Error Propagation". IBM Technical Disclosure Bulletin, Mar. 1981, author unknown.

M. Mansuripur, "Enumerative Modulation Coding with Arbitrary Constraints and Post-Modulation Error Correction Coding for Data Storage Systems", SPIE vol. 1499 Optical Data Storage, 1991, no month.

Adriaan J. van Wijngaarden et al., "Efficient Error Control Schemes for Modulation and Synchronization Codes", IEEE 1998, no month.

Adriaan J. van Wijngaarden et al., "Maximum Runlength-Limited Codes with Error Control Capabilities", IEEE Journal on Selected Areas in Communications, vol. 19, No. 4, Apr. 2001.

William H. Kautz, "Fibonacci Codes for Synchronization Control", IEEE Transactions on Information Theory, Apr. 1965.

Kees A. Schouhamer Immink, "A Practical Method for Approaching the Channel Capacity of Constrained Channels", IEEE Transactions on Information Theory, vol. 43, No. 5, Sep. 1997.

Thomas M. Cover, "Enumerative Source Encoding", IEEE Transactions on Information Theory, vol IT-19, No. 1, Jan. 1973.

Jorge Campello de Souza et al., "Constrained Systems with Unconstrained Positions", IEEE Transactions on Information Theory, vol. 48, No. 4, Apr. 2002.

D.T. Tang et al., "Block Codes for a Class of Constrained Noiseless Channels", Information and Control 17, 1970, no month.

\* cited by examiner

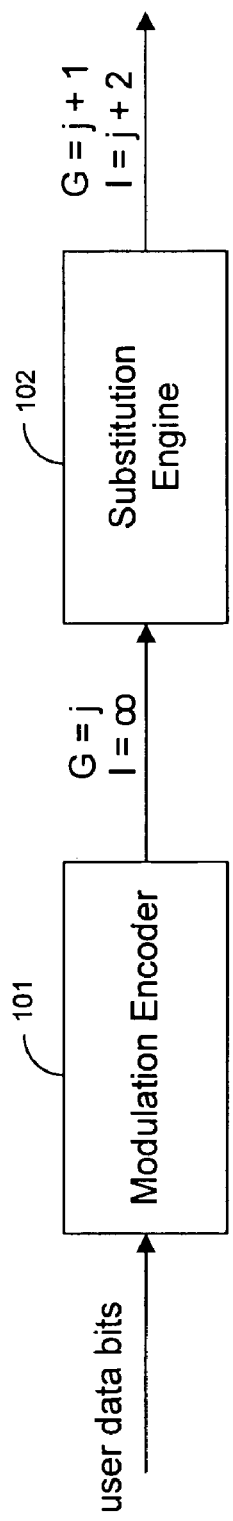

TECHNIQUES FOR GENERATING MODULATION CODES USING RUNNING SUBSTITUTIONS

BACKGROUND OF THE INVENTION

The present invention relates to techniques for generation modulation codes using substitution rules, and more particularly, to techniques for substituting bit sequences that cause errors with bit patterns that are less likely to cause errors.

A disk drive can write data bits onto a data storage disk such as a magnetic hard disk. The disk drive can also read data bits that have been stored on a data disk. Certain sequences of data bits are difficult to write onto a disk and often cause errors during read-back of the data.

Long recorded data sequences of the same polarity are examples of data bit patterns that are prone to errors. These data sequences correspond to long sequences of binary zeros or binary ones in the NRZ (non return-to-zero) representation, or alternatively to long sequences of binary zeros in the NRZI or PR4 representations. Another example of error prone data bit patterns are long sequences of zeros in alternating positions (e.g., 0A0Bb0C0D0 . . . , where A, B, C, D may each be 0 or 1) in the PR4 representation.

Binary sequences are routinely transformed from one representation to another using precoders and inverse precoders, according to well known techniques.

It is desirable to eliminate error prone bit sequences in user input data. Eliminating error prone bit sequences ensures reliable operation of the detector and timing loops in a disk drive system. One way to eliminate error prone bit sequences is to substitute the error prone bit sequences with non-error prone bit patterns that are stored in memory in lookup tables. Lookup tables, however, are undesirable for performing substitutions of very long bit sequences, because they require a large amount of memory.

Many disk drives have a modulation encoder. A modulation encoder uses modulation codes to eliminate sequences of bits that are prone to errors.

Maximum transition run (MTR) constrained codes are one specific type of modulation code that are used in conjunction with a 1/(1+D) precoder. With respect to MTR codes, a j constraint refers to the maximum number of consecutive ones in an NRZI representation, a k constraint refers to the maximum number of consecutive zeros in an NRZI representation, and a t constraint refers to the maximum number of consecutive pairs of bits of the same value in an NRZI representation (e.g., AABBCCDDEE . . . ).

Codes that constrain the longest run of zero digits in the PR4 representation of a sequence are said to enforce a G-constraint where G is the longest allowed run of consecutive zeros. A G constrained PR4 representation is mapped to a k-constrained NRZI representation by a 1/(1+D) precoder, where k=G+1.

Codes that constrain the longest run of zero digits in alternate locations in the PR4 representation of a sequence are said to enforce an I-constraint where I is the longest run of zeros in consecutive odd or even locations. An I-constrained sequence is necessarily G-constrained with G=2I. An I constrained PR4 representation is mapped to a t-constrained NRZI representation by a 1/(1+D) precoder, where t=I.

Fibonacci codes are one example of modulation codes that are used by modulation encoders. Fibonacci codes provide an efficient way to impose modulation code constraints on recorded data to eliminate error prone bit sequences. A Fibonacci encoder maps an input number to an equivalent number representation in a Fibonacci base. A Fibonacci encoder maps an input vector with K bits to an output vector with N bits. A Fibonacci encoder uses a base with N vectors, which is stored as an N×K binary matrix. Successive application of Euclid's algorithm to the input vector with respect to the stored base gives an encoded vector of length N.

Fibonacci codes are naturally constructed to eliminate long runs of consecutive one digits. That is, Fibonacci codes are naturally constructed to enforce a MTR j-constraint. A trivial modification of the Fibonacci code is formed by inverting the encoded sequence to eliminate long runs of consecutive zero digits and enforce a G-constraint or a k-constraint. Further modifications of Fibonacci codes are known in the art to enforce a constraint on both the maximum run of ones and the maximum run of zeros. There are several types of constraint for which a Fibonacci code construction does not exist.

Therefore, it would be desirable to provide a means of extending one family of modulation encoders to enforce additional constraints. For example, Fibonacci codes that enforce a k-constraint can be extended to enforce both a k-constraint and a t-constraint.

BRIEF SUMMARY OF THE INVENTION

The present invention provides techniques for performing substitutions of bit sequences that are known to cause errors. According to the present invention, input data is initially modulation encoded. The modulated data is then analyzed in a sliding window to determine if it contains any bit sequences that are known to cause errors. If an error prone bit sequence is identified in the data, a substitution engine replaces the error prone bit sequence with a substitute pattern of bits that is less likely to cause errors. Substitution is performed in such a way that each unique error-prone sequence is mapped to a unique replacement sequence. The bit stream output of the substitution engine can then be precoded and recorded on a storage medium.

The present invention also includes techniques for decoding patterns of bits that have been substituted for error prone bit sequences during the encoding process. The decoding process identifies the substituted bit pattern and replaces the substituted pattern with the original sequence of bits.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 1 illustrates a system for substituting error prone sequences of bits with less error prone bit patterns, according to an embodiment of the present invention.

FIGS. 2A–2B illustrate two examples of bit sequences that are known to cause errors and replacement bit patterns that are less error prone, according to embodiments of the present invention.

DETAILED DESCRIPTION OF THE INVENTION

Figure 2B:
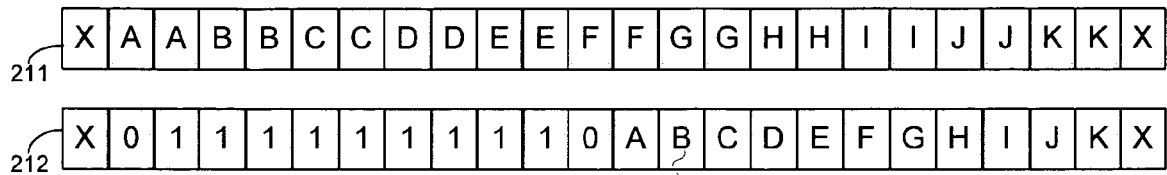

FIG. 1 illustrates a first embodiment of the present invention that performs running substitutions to eliminate long sequences of alternating ones or alternating zeros in a set of modulated data. The system shown in FIG. 1 can be incorporated into a disk drive.

Referring to FIG. 1, a modulation encoder 101 receives a stream of data at its input. The modulation encoder modulates the data using modulation codes such as Fibonacci codes. The modulation encoder imposes a global constraint G=j on the input data (i.e., to eliminate long runs of zeros or ones). Encoder 101 generates codewords that have no more that j consecutive zeros (or ones). Modulation encoder 101 does not impose any limits on the number of alternating zeros. Therefore, the interleaved constraint on the output of encoder 101 is I=∞.

A substitution engine 102 performs running substitutions on the encoded bits generated by encoder 101. Substitution engine 102 analyzes bits in a sliding window, such that each bit is examined many times as the window slides over it. This technique is in contrast to prior art techniques that divide a sequence into non-overlapping blocks which are examined separately.

For example, the substitution engine analyzes bits 1–10 in the first clock cycle, bits 2–11 in the second clock cycle, bits 3–12 in the third clock cycle, bits 4–13 in the fourth clock cycle, etc., instead of analyzing bits 1–10 in the first clock cycle, 11–20 in the second clock cycle, 21–30 in the third clock cycle, etc. In this example, 10 bits are analyzed in each clock cycle; however, substitution engine 102 can analyze any number of bits in a sliding window. The sliding window can be implemented by a shift register. In each clock cycle, a new bit (or group of bits) is shifted in on one side of the register, and an old bit is shifted out on the other side.

Substitution engine 102 analyses the bits generated by encoder 101 in a sliding window to determine if there are any sequences or j+3 or more alternating zeros. If such a sequence of j+3 or more alternating zeros exists, substitution engine 102 replaces the sequence as follows.

The first bit in the substitution is a one. The next (j+1) bits in the substitution are all zeros. The j+1 zeros act as marker that indicates to the decoder that the subsequent bits are part of a running substitution. Because only j consecutive zeros are allowed in the codewords generated by encoder 101, a sequence of j+1 consecutive zeros can only mean that the subsequent bits are part of a running substitution.

After the j+1 zero bits, the next bit in the substitution is a one. After this second one, the next j+3 bits are the same as bits in the original codeword sequence that were located in between the j+3 alternating zeros. The output of substitution engine 102 is a sequence of codewords that have a global constraint of G=j+1 and an interleaved constraint of I=j+2.

The substitution operation is carried out over j+3 clock cycles as the encoder outputs the fixed pattern. After the substitution operation is complete the sliding window still contains the j+3 bits from the original codeword plus j+3 new bits which were input to the substitution engine during the substitution operation. In this way, the substitute sequence is itself checked for violations.

Modulation encoded codewords can be concatenated to obtain a sequence of concatenated codewords. The embodiment of FIG. 1 can also be extended to concatenated codewords. If the pre-concatenated codewords have been constrained using an inverted j constrained maximum transition run code, substitution engine 102 can use the substitution rules described above to constrain the concatenated codewords to obtain modulated constraints G=j+1 and I=j+2.

FIG. 2A illustrates an example of how substitution engine 102 can eliminate sequences of alternating zeros in the PR4 representation of an encoded sequence.

Modulation encoder 101 generates a stream of bits that are input into substitution engine 102. Substitution engine 102 analyzes this stream of bits in a sliding window. In the example of FIG. 2A, substitution engine 102 analyzes sets of 25 constrained bits 201 in PR4, as shown in FIG. 2A. Bits 201 have a global constraint of G=9 and an interleaved constraint of I=∞

Bit sequence 201 includes 12 alternating zeros. The 13 other bits are labeled X, A, B, C, D, E, F, G, H, I, J, K and Y. These bits are labeled with letters to indicate that each bit can be either 1 or 0.

Substitution engine 102 replaces bit sequences that contain more than 11 alternating zeros, such as sequence 201, with a substituted pattern of bits 202. The first bit X in the substituted pattern of bits 202 before the first alternating zero is the same as the first bit in original sequence 201. The next bit in sequence 202 is a one.

The subsequent 10 bits in pattern 202 are all zeros. Since the substitution engine allows 10 consecutive zeros in pattern 202, the global constraint of the output bit stream is increased to G=10. A decoder recognizes the 10 consecutive zeros as a marker that indicates a substitution has been made according to predefined substitution rules, because the modulation encoder 101 does not generate bit sequences with more than 9 consecutive zeros.

The next bit after the 10 consecutive zeros is a 1. The next 12 bits in sequence 202 are A B C D E F G H I J K Y. Thus, the bits interleaved between the 12 alternating zeros are de-interleaved and placed together at the end of the substituted bit sequence 202.

The codewords generated by substitution engine 102 have a global constraint of G=10 and an interleaved constraint of I=11 (no more than 11 alternating zeros). During the decoding process, the 12 bits following the 10 consecutive zeros and the next 1 bit are interleaved with alternating zeros to reconstruct the original codeword sequence.

FIG. 2B illustrates another example of how substitution engine 102 can eliminate sequences of duplicate bits in a set of data encoded in non-return to zero inverted format (NRZI). NRZI is another well known method of translating magnetic patterns written on magnetic media into digital bits. Example of substituting data encoded in PR4 and NRZI formats are used merely as examples and are not intended to limit the scope of the present invention. One of skill in the art will understand that the substitution techniques of the present invention can be applied to any format for encoding data on a medium. Also, the present invention is not limited to techniques for encoding and decoding data written onto and read from magnetic media. The present invention also applies to optical media and other types of computer readable media.

In NRZI type of constraints, it is important to limit the total number j of consecutive ones, the number k of consecutive zeros, and the total number t of consecutive pairs of bits. If the total number t of consecutive pairs of bits is limited, the number k of consecutive zeros is automatically limited to 2t. For that reason, the following embodiment concentrates on limiting the numbers j and t. A set of 21 bits 211 of (j, k, t) constrained modulation code in NRZI is shown in the example of FIG. 2B. Bits 211 have a global constraint of j=8 and an interleaved constraint of t=∞ Substitution engine 102 analyzes the bits generated by encoder 101 in a sliding window.

The bit sequence 211 includes 11 consecutive duplicate pairs of bits. The bit pairs are labeled AA, BB, CC, DD, EE, . . . through KK. Substitution engine 102 identifies bit sequences such as sequence 211 that contain more than 10 duplicate pairs of bits and replaces these bit sequences with a substituted sequence of bits 212. The first bit X in the substituted sequence of bits 212 is the same as the first bit in sequence 211. The next bit in sequence 212 is a zero. The subsequent 9 bits in sequence 212 are all ones.

Because the substitution engine allows 9 consecutive ones in the substituted sequence 212, the global constraint of the output bit stream is increased from j=8 to j=9. A decoder recognizes the 9 consecutive ones as a marker that indicates a substitution has been made according to predefined substitution rules. The next bit after the 9 consecutive ones in sequence 212 is a 0. The next 11 bits in sequence 212 are A–K. Thus, bits A–K in sequence 211 are placed together at the end of substituted bit sequence 212.

The codewords generated by substitution engine 102 have a global constraint of j=9, a zero-run constraint of k=20 and an interleaved constraint of t=10. During the decoding process, a decoder recognizes the 9 consecutive ones as a marker of a substitution performed after modulation encoder 101, because the modulation encoder constrains the data to having no more than 8 consecutive ones. The decoder duplicates each of the 11 bits following the 9 consecutive ones and the next zero bit to reconstruct the original codeword sequence.

Figure 2C:
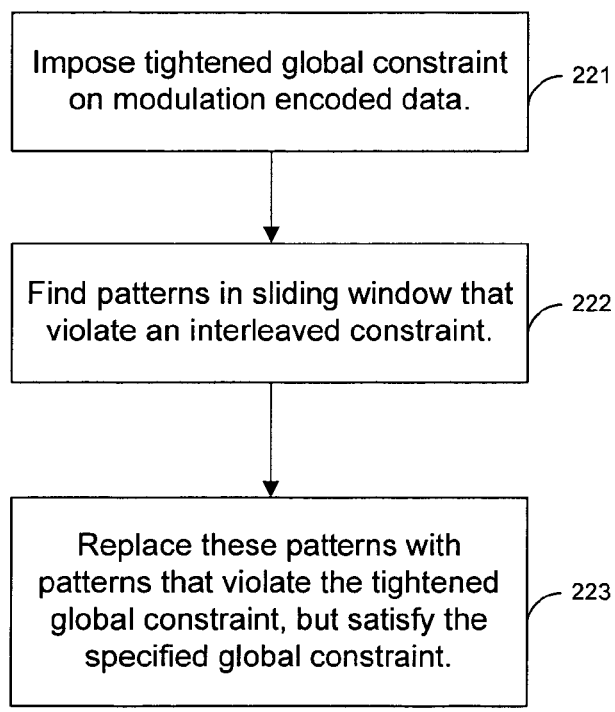
FIG. 2C illustrates a process of the present invention that eliminates error prone bit sequences in data streams.

FIG. 2C illustrates a process for replacing unwanted bit sequences in a modulated set of data using substitution rules according to an embodiment of the present invention. The process of FIG. 2C is applicable to an NRZ, NRZI, PR4 or any other representation of the encoded sequence.

At step 221, a tightened global constraint is imposed on a set of data that has been modulation encoded with a global constraint G. For example, if a set of data has a global modulation constraint of G, a tightened global constraint of G–1 can be imposed on that set of data at step 221. The tightened global constraint can be applied by modulation encoder 101.

At step 222, the set of bits is analyzed in a sliding window to identify patterns of bits that violate an interleaved constraint. For example, patterns of more than 10 alternating zeros can be identified.

At step 223, the sequences of bits that violate the interleaved constraint are replaced with patterns of bits that violate the tightened global constraint, but that satisfy the specified global constraint G. The specified global constraint G is larger than the tightened global constraint that was imposed on the original set of data by modulation encoder 101.

The bit patterns that violate the tightened global constraint indicate to a decoder that a substitution was made during the encoding process, because patterns that violate the tightened global constraint were not allowed before substitutions were made. Because the substituted pattern of bits satisfies the specified global constraint G, and the rest of the data satisfies the tightened global constraint (from step 221), the entire output bit sequence of the process of FIG. 2C satisfies global constraint G.

Figures 3, 4:
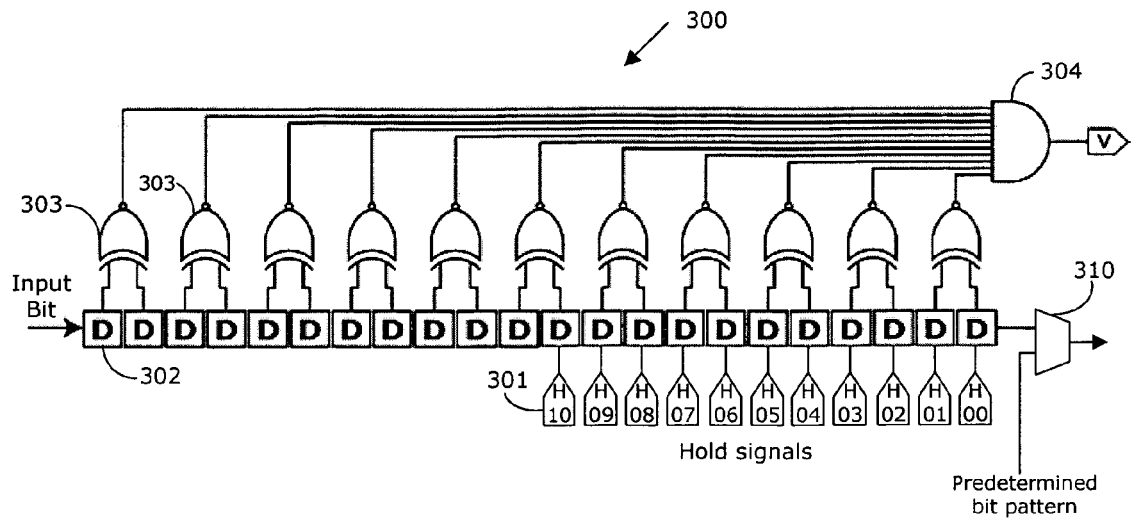
FIG. 3 illustrates an encoder that identifies and eliminates bit sequences that are known to cause errors, according to an embodiment of the present invention.
FIG. 4 illustrates examples of bit sequences stored in and generated by the encoder of FIG. 3.

FIG. 3 illustrates an embodiment of an encoder 300 that can be used to substitute error prone bit sequences in modulated data encoded in NRZI format. Encoder 300 uses substitution techniques of the present invention. Encoder 300 is an example of substitution engine 102. Encoder 300 can be implemented in hardware or in software.

Encoder 300 analyzes input data bits stored in shift register 302 in a sliding window. The input data is shifted into shift register 302 bit-by-bit from left to right in each clock cycle. Shift register 302 can store up to 22 bits. Exclusive NOR (XNOR) gates 303 each have two inputs coupled to two adjacent storage units of shift register 302. The output signal of each XNOR gate 303 goes high when both of its input signals are the same (either both high or both low).

The output signal of AND gate 304 goes high only when the output signals of all of XNOR gates 303 are high. Thus, a high signal at the output of AND gate 304 indicates that there are 11 pairs of bits stored in shift register 302 each having two bits with the same value. This bit sequence can be represented as A A B B C C D D E E F F G G H H I I J J K K. This bit sequence is flagged by AND gate 304 as a bit sequence that needs to be replaced according to predefined substitution rules. Thus, the output of AND gate 304 is responsive to a sliding window of data stored in register 302 that changes by one bit in each clock cycle.

Input terminals 301 transmit 11 hold signals H00–H10 to inputs of 11 of the rightmost storage units in shift register 302. When a hold signal is high, the corresponding storage unit of shift register 302 maintains the value of its stored bit, regardless of the state of the clock signal. When a hold signal is low, a bit is shifted into the storage unit coupled to that hold signal during each clock cycle.

Details of the operation of encoder 300 are now described with respect to FIG. 4. The table shown in FIG. 4 represents the contents of shift register 302. Each column indicates a bit stored in one of the 22 storage units of register 302. Each row of the table represents the bits stored in register 302 during a different clock cycle. The bits in each subsequent row of the table shift to the right within register 302 in a sliding window.

The underlined bits in the table are frozen in a storage unit of register 302, because a hold signal has caused the storage unit to maintain the bit value. Encoder 300 also includes a multiplexer 310 that receives the output of register 302 or a predetermined bit sequence. The output of multiplexer 310 is shown to the right of the table in FIG. 4.

When shift register 302 contains the bit sequence A A B B C C D D E E F F G G H H I I J J K K, the hold signal H00 goes high, causing the storage unit coupled to H00 to maintain bit K. Hold signals H01–H10 are low. During the next clock cycle, the bits in shift register 302 are shifted to the right by one bit, except the bit in the storage unit coupled to H00, as shown by the underlined bit K in row 2 of the table. The bit stored in the storage unit coupled to H01 is lost, because that bit cannot be shifted to the next register. During the same clock cycle, multiplexer 310 outputs a 0 bit according to a predetermined bit pattern. Multiplexer 301 outputs the predetermined bit pattern only after the output of AND gate 304 transitions high.

Subsequently, hold signals H01 and H02 are high, causing the corresponding storage units to maintain bits J and K. Hold signals H03–H10 are low. During the next clock cycle, the bits in shift register 302 shift to the right by one bit, except underlined bits J and K in row 3 of the table. Multiplexer 310 outputs a 1 bit, according to the predetermined bit pattern.

In each subsequent clock cycle, the next hold signal goes high, and the next storage unit maintains its stored bit value. The bit values that have been frozen are underlined in the table of FIG. 4. The complete predetermined bit pattern is shown in the last row on the right of FIG. 4 (i.e., 01111111110).

Once bits A–K have been frozen in the rightmost 11 storage units of shift register 302, all of the hold signals transition low. Multiplexer 310 now outputs the contents of shift register 302 bit-by-bit. Thus, multiplexer 310 outputs bits A–K without the duplicate bit pairs, immediately following predetermined bit pattern 01111111110. Multiplexer 310 continues to output each bit shifted out of the right side of shift register 302, until the output of AND gate 304 goes high again.

Figures 5, 6:
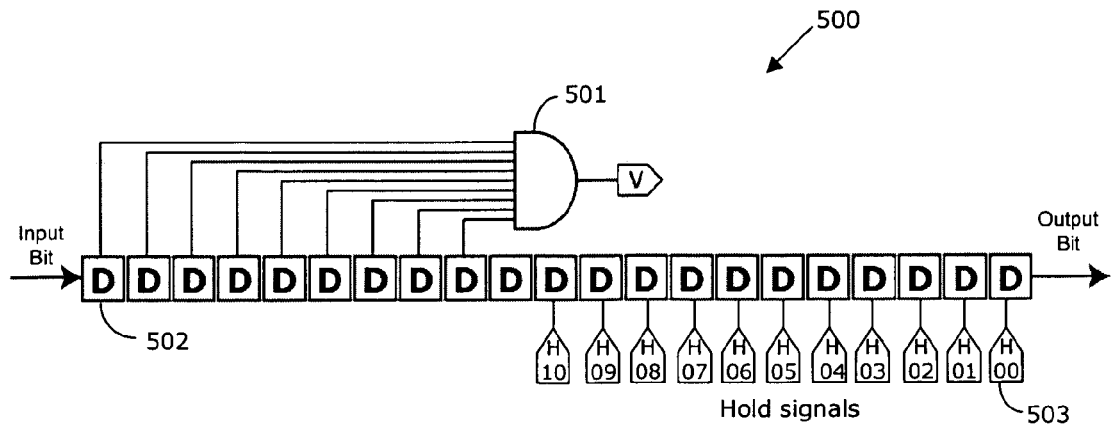
FIG. 5 illustrates a decoder that identifies substituted bit patterns and replaces them with the original error prone bit sequences, according to an embodiment of the present invention.
FIG. 6 is a chart that illustrates the operation of the decoder in FIG. 5.

FIG. 5 illustrates an embodiment of a decoder 500 that can be used to convert a pattern of bits generated by encoder 300 back into the original data stream. Bits are shifted through shift register 502 bit-by-bit from left to right in each clock cycle. AND gate 501 performs an AND function on the bits stored in the first 9 storage units of shift register 502. Thus, the output of AND gate 501 is responsive to a sliding window of data stored in register 502 that changes by one bit in each clock cycle.

FIG. 6 illustrates contents of shift register 502 in multiple clock cycles. Each row corresponds to a different clock cycle. The outputs of shift register 502 are shown to the right of the table. Bits are shifted into register 502 during the decoding process in the opposite direction, compared to the encoding process.

Hold signals H00–H10 are coupled to input terminals 503 of the rightmost 11 storage units in shift register 502. The hold signals cause the storage unit to maintain their values, regardless of the state of the clock signal. In the table of FIG. 6, the underlined bits represent the bits that have been frozen in storage units of register 502 by a hold signal.

When the bits stored in the first 9 storage units of shift register 502 are all ones as shown in the first row of the table in FIG. 6, the output of AND gate 501 is high. All of the hold signals H00–H10 at input terminals 503 transition high after the output of AND 501 goes high. When all the hold signal are high, the rightmost 11 storage units of register 502 maintain their values, as represented by the underlined bits in the second row of the table.

In the next clock cycle, bit A is shifted out of register 502, and bit 0 is lost, because the 11 storage units coupled to the hold signals are maintaining their current states. In the next clock cycle, hold signals H09–H00 transition low, and hold signal H10 remains high. A duplicate of bit A is shifted out of register 502, and a duplicate of bit K is formed in the storage unit coupled to hold signal H09. In the next clock cycle, all of the hold signals H10–H00 are high, the bits in the rightmost 11 storage units maintain their current values, and bit B is shifted out of register 502.

In the next clock cycle, hold signals H10–H08 remain high, and hold signals H07–H00 transition low. A duplicate of bit J is formed in the storage unit coupled to hold signal H07, and a duplicate of bit B is shifted out of register 502. In the next clock cycle, all of the hold signals H10–H00 are high, the bits in the rightmost 11 storage units maintain their values, and bit C is shifted out of register 502. In the next clock cycle, hold signals H10–H06 remain high, and hold signals H05–H00 transition low. A duplicate of bit I is formed in the storage unit coupled to hold signal H05, and a duplicate of bit C is shifted out of register 502.

This cycle continues until the complete bit pattern (AAB-BCCDDEEFFGGHHIIJJKK) is shifted out of register 502. The flag bit pattern 01111111110 is erased bit-by-bit, because hold signal H10 causes storage unit 502 to maintain the values of the K bit through 11 clock cycles. New bits (LMNOP . . . ) are shifted into register 502 from the left in each clock cycle.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiment disclosed, but that the invention will include all embodiments and equivalents falling within the scope of the claims.

What is claimed is:

1. A disk drive controller comprising:
    a modulation encoder that encodes data to generate encoded data; and
    a substitution engine that performs substitutions of bit patterns within a sliding window of the encoded data, wherein the bit patterns of the encoded data match at least one prohibited bit patterns,
    wherein the substitution engine includes a shift register that stores the bit patterns within the sliding window, the shift register storing one new bit and discarding one old bit in each clock cycle,
    wherein the substitution engine performs at least one logic function on bits in each storage unit of the shift register in each clock cycle, wherein the at least one logic function tests for a prohibited pattern during each clock cycle.

2. The disk driver controller according to claim 1 wherein the substitution engine holds bits in a subset of storage units of the shift register if the output of the logic function indicates the at least one prohibited bit pattern.

3. The disk driver controller according to claim 1 further comprising:
    a decoder including a shift register that stores bit patterns within a sliding window, the shift register storing one new bit and discarding one old bit in each clock cycle.

4. The disk drive controller according to claim 3 wherein the decoder performs a logic function on bits stored in a first set of storage units of the shift register, and hold bits stored in a second set of storage units of the shift register if the output of the logic function indicates the at least one prohibited bit pattern.

5. The disk driver controller according to claim 1 wherein the modulation encoder generates encoded data constrained by a first global constraint, and the substitution engine replaces bit patterns in the sliding window that violate an interleaved constraint with bit patterns that satisfy the interleaved constraint and a second global constraint that is less strict than the first global constraint.

6. A method for performing modulation encoding on data prior to recording the data on a computer readable medium, the method comprising:
    performing modulation encoding on the data to generate encoded data; and substituting patterns of bits within a sliding window of the encoded data that match a prohibited bit pattern to generate substitute patterns, wherein substituting the patterns of bits within the sliding window further comprises performing a logic function on the bits in the sliding window in each clock cycle, and holding a subset of the bits in bit positions within the sliding window for more than one clock cycle if the logic function indicates the prohibited bit pattern.

7. The method according to claim 6 further comprising:

decoding the substitute patterns by performing a logic function on a first set of bits in the sliding window, and holding a second set of bits in the sliding window if the output of the logic function indicates the prohibited bit pattern.

8. The method according to claim 6, wherein the subset of bits held consists of every other bit position within the prohibited bit pattern.

9. The method according to claim 6, wherein during the clock cycles that the bits are held, further comprising outputting a bit pattern of a first bit having a first value followed by a series of bits having a second value and a last bit having the first value.

10. A method for performing modulation encoding on data prior to recording the data on a computer readable medium, the method comprising:

performing modulation encoding on the data to generate encoded data; and substituting patterns of bits within a sliding window of the encoded data that match a prohibited bit pattern to generate substitute patterns, wherein performing the modulation encoding comprises imposing a first global constraint on the encoded data, and substituting the patterns of bits in the sliding window further comprises substituting patterns of bits in the sliding window that violate an interleaved constraint with bit patterns that satisfy the interleaved constraint and a second global constraint that is less strict than the first global constraint.

11. A disk drive system comprising:

a modulation encoder that encodes data to generate encoded data constrained by a first global constraint; and a substitution engine that identifies sequences of bits in the encoded data that violate an interleaved constraint, and replaces the sequences of bits that violate the interleaved constraint with bit patterns that satisfy the interleaved constraint.

12. The disk drive system defined in claim 11 wherein the substitution engine replaces the sequences of bits with bit patterns that satisfy a second global constraint that is less strict than the first global constraint.

13. The disk drive system defined in claim 12 wherein the first global constraint allows a maximum of j consecutive bits in the encoded data and the second global constraint allows a maximum k consecutive bits in the encoded data, wherein k>j.

14. The disk drive system defined in claim 13 wherein the first global constraint allows a maximum of j consecutive zeros in the encoded data and the second global constraint allows a maximum of j+1 consecutive zeros in the bit patterns.

15. The disk drive system defined in claim 14 wherein the interleaved constraint allows a maximum of j+2 alternating zeros in the encoded data and in the bit patterns.

16. The disk drive system defined in claim 12 wherein the substitution engine comprises an encoder that includes a first shift register, a plurality of XNOR gates coupled to storage units of the first shift register, and a first AND gate coupled to outputs of the XNOR gates, wherein the data is encoded in NRZI format.

17. The disk drive system defined in claim 16 further comprising:

a decoder that includes a second shift register and a second AND gate coupled to a plurality of storage units of the second shift register, wherein the decoder is coupled to receive data read from a medium on which the encoded data and bit patterns are stored.

18. The disk drive system defined in claim 11 wherein the modulation encoder is a Fibonacci encoder.

19. A method for performing modulation encoding on data prior to recording the data on a computer readable medium, the method comprising:

performing modulation encoding on the data to generate encoded data constrained by a first global constraint;

identifying sequences of bits in the encoded data that violate an interleaved constraint; and substituting the sequences of bits that violate the interleaved constraint with bit patterns that satisfy the interleaved constraint and a second global constraint.

* * * * *

UNITED STATES PATENT AND TRADEMARK OFFICE
CERTIFICATE OF CORRECTION

PATENT NO. : 7,142,134 B2  Page 1 of 1
APPLICATION NO. : 11/049554
DATED : November 28, 2006
INVENTOR(S) : Blaum et al.

It is certified that error appears in the above-identified patent and that said Letters Patent is hereby corrected as shown below:

<u>In Claim 1, column 8, line 30</u>:

Please delete "patterns" and replace it with --pattern--

Signed and Sealed this

Fifth Day of June, 2007

JON W. DUDAS
*Director of the United States Patent and Trademark Office*